United States Patent
Bula et al.

(10) Patent No.: US 6,704,695 B1
(45) Date of Patent: Mar. 9, 2004

(54) INTERACTIVE OPTICAL PROXIMITY CORRECTION DESIGN METHOD

(75) Inventors: Orest Bula, Shelburne, VT (US); Daniel C. Cole, Jericho, VT (US); Edward W. Conrad, Jeffersonville, CT (US); William C. Leipold, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/354,879

(22) Filed: Jul. 16, 1999

(51) Int. Cl.⁷ .................................................. G06G 7/48
(52) U.S. Cl. ............................................ 703/6; 716/19
(58) Field of Search ........................ 703/22, 6; 430/5; 716/21, 19; 700/120, 121, 109, 110

(56) References Cited

U.S. PATENT DOCUMENTS

| | | | |
|---|---|---|---|
| 4,902,899 A | | 2/1990 | Lin et al. |
| 5,631,110 A | | 5/1997 | Shioiri et al. |
| 5,698,346 A | | 12/1997 | Sugawara |
| 5,705,301 A | | 1/1998 | Garza et al. |
| 5,707,765 A | | 1/1998 | Chen |
| 5,723,233 A | | 3/1998 | Garza et al. |
| 5,725,974 A | | 3/1998 | Kawahira |
| 5,795,688 A | | 8/1998 | Burdorf et al. |
| 6,078,738 A | * | 6/2000 | Garza ........................ 395/500 |
| 6,081,659 A | * | 6/2000 | Garza ........................ 395/500 |
| 6,226,781 B1 | * | 5/2001 | Nistler et al. ................. 716/19 |
| 6,263,299 B1 | * | 7/2001 | Aleshin ........................ 703/5 |
| 6,301,697 B1 | * | 10/2001 | Cobb ........................... 716/19 |
| 6,327,033 B1 | * | 12/2001 | Ferguson .................... 356/394 |
| 2002/0019729 A1 | * | 2/2002 | Chang et al. .................. 703/6 |

OTHER PUBLICATIONS

Microsoft Press Computer Dictionary refers to Microsoft Press Computer Dictionary, Third Edition, Microsoft Press, 1997, ISBN 1–57231–446–X, flowchart definition and example on p. 201 and 202.*

Hercules–II 2000. 4.3 Manual, vol. 1, Table of Contents, Avant, pp. 1–20 and Chapter 6, pp. 1–16.

* cited by examiner

*Primary Examiner*—Kevin J. Teska
*Assistant Examiner*—Eduardo Garcia-Otero
(74) *Attorney, Agent, or Firm*—McGinn & Gibb, PLLC; Richard M. Kotulak, Esq.

(57) ABSTRACT

A method and structure for creating a photomask data set includes inputting a design data set, creating a simulated printed data set by applying a lithography simulation model to chosen levels of the design data set, merging each chosen level of the design data set with each corresponding level of the simulated printed data set in order to produce a merged design data set, applying at least one test to the merged design data set, correcting the design data set based on results of the test to produce a corrected design data set, repeating the creating of the simulated printed data, merging, applying the test and correcting using the corrected design data set until the corrected design data set passes the test, and outputting the corrected design data set as the photomask data set.

23 Claims, 14 Drawing Sheets

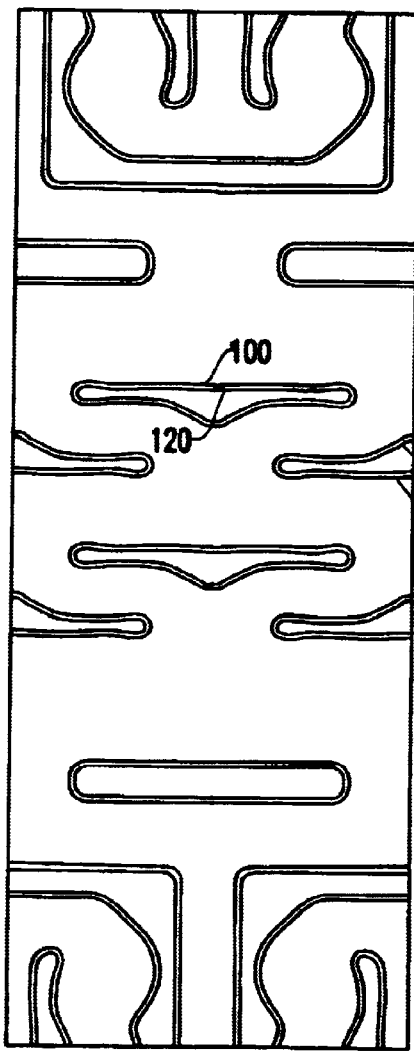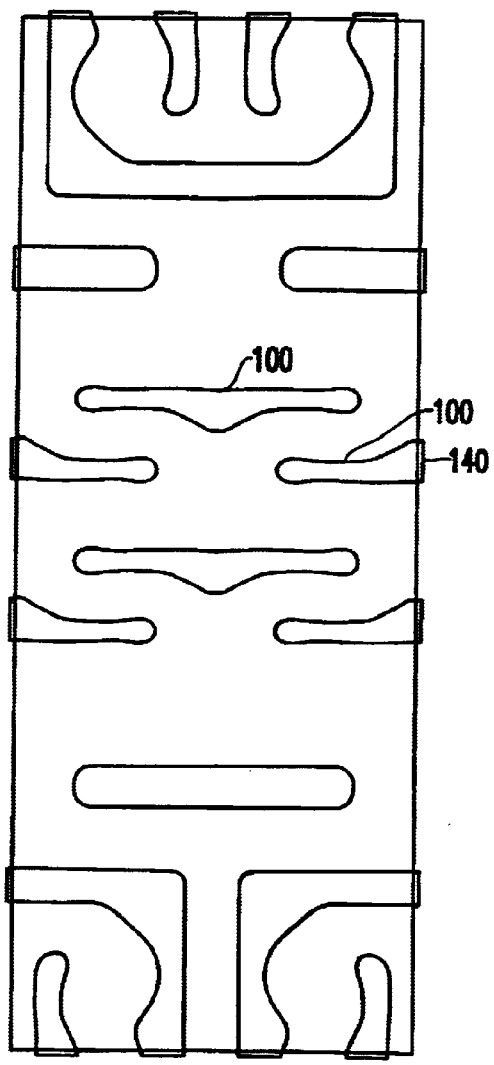
FIG.11B                    FIG.11C

INTERACTIVE OPTICAL PROXIMITY CORRECTION DESIGN METHOD

BACKGROUND OF THE INVENTION

1. Field of the Invention

The present invention generally relates to integrated circuit designs and more particularly to an improved method of comparing designs with simulated images of the designs.

2. Description of the Related Art

The design of integrated circuits involves multiple stages of distinctly different types of activity. More specifically, a designer creates a schematic circuit to achieve specific goals. The schematic circuit is an arrangement of various logic devices that are connected to perform some logical activity. The designer then generally uses a computer-aided design (CAD) program to prepare a design data set. The design data set is a theoretical illustration of conducting, insulating and semiconducted shapes which should be manufactured to form the logic devices shown in the schematic circuit. The design data does not include or account for process variations or manufacturing mask and wafer effects which would occur during actual production of the items shown in the design data set.

In order to promote the production of working logic devices that achieve the designer's goals including yield, cost and performance, the design data set is processed through various algorithms which account for processing variations and manufacturing effects, such as simulation tools that may include Optical Proximity Correction (OPC) capabilities. Such programs produce simulation data based on the design data set.

The simulation data is then checked to determine whether the design data set should be modified to eliminate any possible manufacturing defects, such as incompletely formed structures, improperly formed intersections, unwanted intersections (e.g., short circuits) or other similar defects. Once the simulation data indicates that the design data set would produce acceptable working items, the design data set is transferred to a manufacturing format to produce lithographic masks and other similar items necessary to produce the integrated circuit.

One drawback of this system is the fact that the simulation is run on a different tool (program) than the one used to create the design. Another drawback is the inability to check such things as the effect of OPC on overlay tolerance on the simulation tool.

Further, the iterative process of repeatedly modifying the design data set and checking the simulation data is laborious, time-consuming and substantially increases the cost of the items produced. Therefore, there is a need to reduce the expensive and laborious process of separately designing and simulating logic circuit designs.

SUMMARY OF THE INVENTION

It is, therefore, an object of the present invention to provide a structure and method for creating a photomask data set that includes inputting a design data set which has at least two levels, creating a simulated printed data set which has the same levels by applying a lithographic or other simulation model to each level of the design data set under consideration, merging each level of the design data set with each corresponding level of the simulated printed data set to produce a merged design data set, applying at least one test to either the merged design data set or the simulated printed data set, and correcting the design data set based on results of the test to produce a corrected design data set. The creation of the simulated printed data, merging, applying the test and correcting processes are repeated using the corrected design data set until the corrected design data set passes the test or no further corrections can be made. The corrected design data set is output as the photomask data set.

The converted format of the simulated printed data set complies with the format of the design data set. The merging includes overlaying each level of the design data set on each corresponding level of the simulated printed data to produce overlaid images. The test includes identifying differences between the design data and the simulated printed data. The creation of the simulated printed data set and the merging are performed sequentially in near real time as the design data set is corrected. The creation of the simulated printed data modifies the design data set to include predicted manufacturing changes.

A second embodiment of the invention includes inputting design data for at least two levels, producing simulated printed data from the design data, overlaying the simulated printed data levels to produce overlaid data, testing the overlaid data, correcting the design data based on results of the test to produce corrected design data, repeating the process using the corrected design data until the corrected design data passes the testing, and outputting the corrected design data as the photomask data.

The format of the simulated printed data is converted to comply with the format of the design data. The testing comprises checking relationships such as spaces or overlap areas between shapes on different levels. The producing of the simulated printed data and the overlaying can be performed in real time as the design data is corrected. The producing of the simulated printed data modifies the design data to include predicted manufacturing changes. The design and simulated printed data include multiple levels. The overlaid data includes multiple levels of overlaid images which are distinguished by color, shading or brightness.

Another embodiment of the invention includes inputting design data, producing simulated printed data from the design data, altering the format of the simulated printed data to comply with the format of the design data, overlaying the design data to detect differences between the design data and the simulated printed data, correcting the design data based on the differences between the design data and the simulated printed data to produce corrected design data, repeating the process using the corrected design data until the corrected design data is functionally the same as the design data, and outputting the corrected design data as the photomask data.

The producing of the simulated printed data, which modifies the design data to include predicted manufacturing changes, and the overlaying are performed in real time as the design data is corrected. The design and simulated printed data include multiple levels, and the overlaying produces multiple levels of overlaid images which can be distinguished by color, shading or brightness.

The ability to view simulated wafer printed images interactively on a screen with the original design helps the designer determine what needs to be fixed or adjusted on the original design. The invention also determines if the overlap area between two levels is large enough for contact between the two levels, given that there are variations in overlay between the two levels.

The ability to view the overlap is important but the ability to determine if variations of overlap can be tolerated can be extremely important. A contour plot (plot of constant intensity of aerial images, wafer outline of shapes in a developed or undeveloped resist) can be easily placed over the original design data but the ability of the CAD tool to determine what shapes are closed and therefore moveable is not obvious by just looking at the contour data itself.

Thus, the invention includes an algorithm to determine what shapes are closed and therefore moveable prior to loading the data into the CAD programs. The CAD programs move the shapes, calculate the area of shapes, calculate intersection area between two levels, expand or shrink the shapes, etc.

The invention allows device designers to simultaneously view both as designed images and simulated printed images on a standard design system and to manipulate both image types with the standard tool kits of the design system. The invention overcomes the problems of conventional systems by converting the simulation data to a format which is consistent with the format of the design data. By overlaying the simulation data on the design data, the specific corrections which should be made to the design data set become easier to recognize. Further, the invention may produce the simulation data as the designer creates/modifies the design data set so that the conventional iterative process of repeatedly producing the simulation data, viewing the results in a second tool, modifying the design data set and viewing those results in the CAD tool is simplified.

BRIEF DESCRIPTION OF THE DRAWINGS

The foregoing and other objects, aspects and advantages will be better understood from the following detailed description of a preferred embodiment of the invention with reference to the drawings, in which:

FIG. 11B is a schematic diagram of the original contours and a shrunken/etch plot of the original shapes; and FIG. 11C is a schematic diagram of how to extend the sides of the contour that touch the outline.

DETAILED DESCRIPTION OF PREFERRED EMBODIMENTS OF THE INVENTION

As mentioned above, the conventional iterative process of generating simulation data from a design data set and repeatedly modifying the design data set to correct errors discovered in the simulation data is laborious and expensive. The time, resources and labor involved with eliminating errors which are discovered in the simulation data is excessive because the computer-aided design (CAD) program produces the design data sets in a format which is inconsistent with the simulation data format produced by the simulation tool. Therefore, the simulation data must be checked for errors independently from the design data set. Further, the corrections to the design data set mandated by the simulation data must also be made independently.

The invention overcomes these problems by converting the simulation data to a format which is consistent with the format of the design data to allow the design data to be directly compared to (e.g., overlaid on) the simulation data. By overlaying the simulation data on the design data, the specific corrections which should be made to the design data set become easier to recognize. Further, the invention may produce the simulation data as the designer creates/modifies the design data set so that the iterative process of repeatedly producing the simulation data and modifying the design data set is eliminated. In other words, with the invention, the designer is provided with simulation data as the design is being created with the computer-aided design program. More specifically, the simulation data is overlaid on the design data set during the creation of the design data set to allow the designer to be immediately aware of potential defects in the circuit as the design data set is being created.

Figure 1:
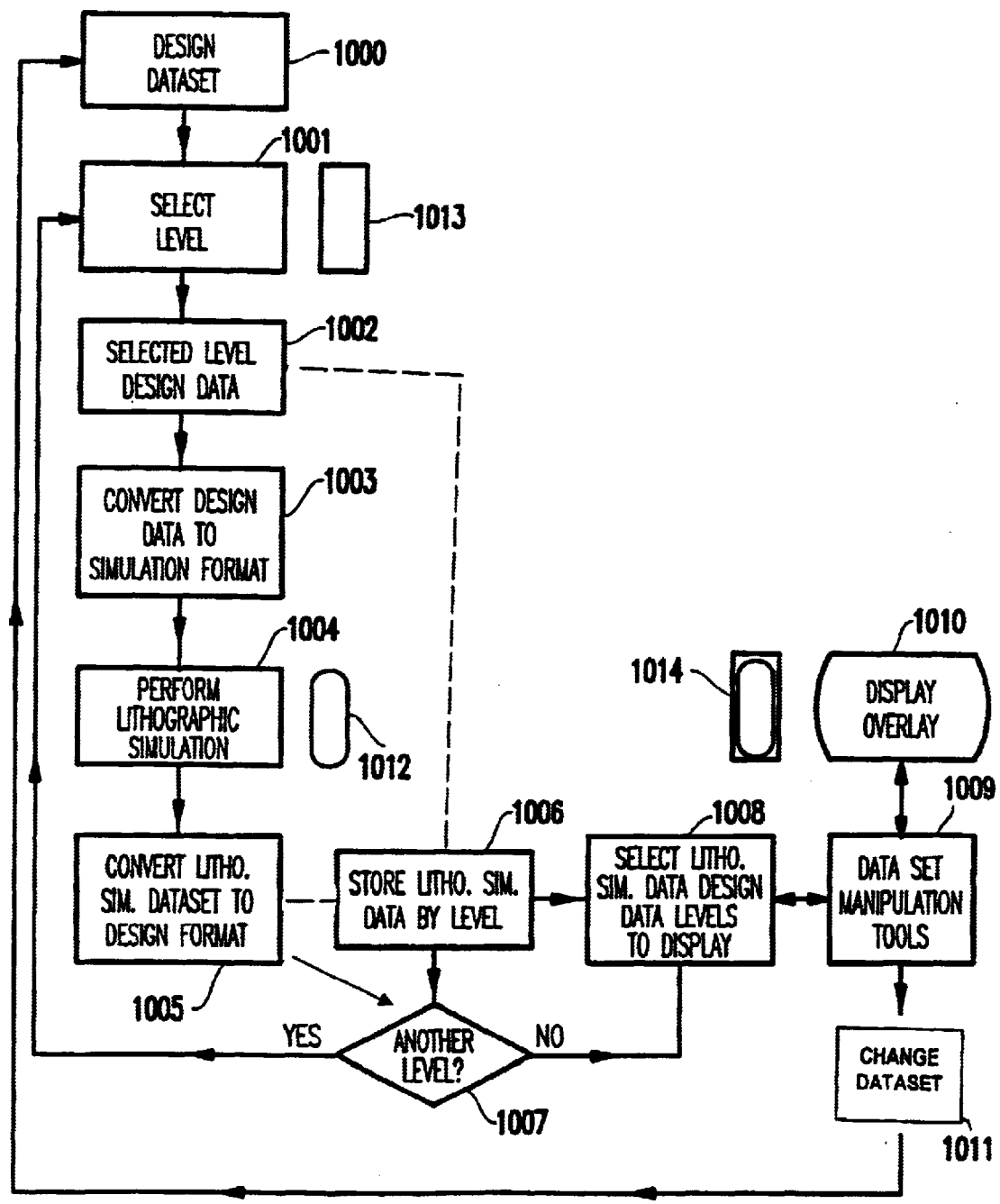
FIG. 1 is a flow diagram illustrating a preferred method of the invention.

Referring now to the drawings, and more particularly to FIG. 1, a flowchart of an embodiment of the invention is illustrated. The example illustrated in FIG. 1 breaks the design data sets into different levels. For example, it is common to design semiconductor integrated circuit chips to include multiple wiring levels. The embodiment of the invention shown in FIG. 1 simulates each level separately. Therefore, for example, the invention would simulate each wiring level independently. However, the invention is not limited to a system which divides a design data set into different levels and is equally applicable to any design system including one which processes only a single level or one which simultaneously processes multiple levels. The example shown in FIG. 1 has been chosen to promote understanding of the invention and to illustrate one of the many applications to which the invention is applicable.

A design level (e.g., a wiring level) is selected 1001 from a given design data set 1000 that has been previously created by a CAD or similar program, as discussed above. The rectangle 1013 represents an exemplary design image (e.g., a logical device or portion of a logical device) within that level of the design data set. This selected data 1013 along with the other devices/features in the selected level of the design data set are copied to a data storage file 1006 and a conventional data conversion routine 1003 converts the selected level design data 1002 to a format suitable for simulation.

Next, the simulation tool 1004 produces simulation data for the selected level of design data. The oval 1012 represents the simulated printed image 1013. Next, the simulated printed image 1012 is converted 1005 to a form useable by the design system (as discussed in greater detail below) and the simulated printed image 1012 is placed in the data storage file 1006. Therefore, the data storage 1006 has both the design data and simulation data for a given level of the design data set.

If another level of the design data set is to be simulated, the loop 1000–1006 is repeated as shown in item 1007. If the another level is not to be simulated, the stored data 1012, 1013 is selected 1008 from the file 1006 and displayed 1010. The design image 1013 and the simulated printed image 1012 are overlaid 1014 to allow the designer to immediately determine what portions of the design data set are involved with a potential defect. Further, as the designer alters/creates the design data set 1011 using the manipulation tools, the overlaid simulation changes accordingly (potentially in "real time", given a fast enough processor). Also, with the invention, more than one level of the design data set can be simultaneously displayed using different colors, shading, brightness, etc. to distinguish the different levels if necessary.

Figure 2:
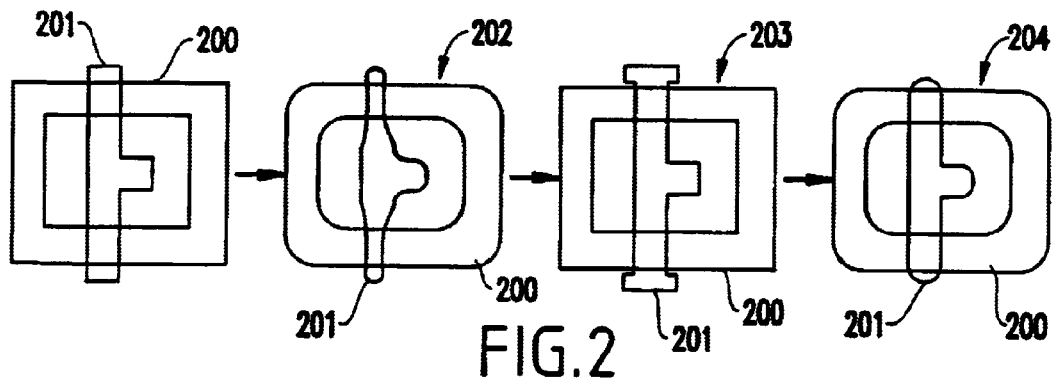
FIG. 2 is a series of design data sets and simulation data illustrating advantages of the invention.
Figure 3:
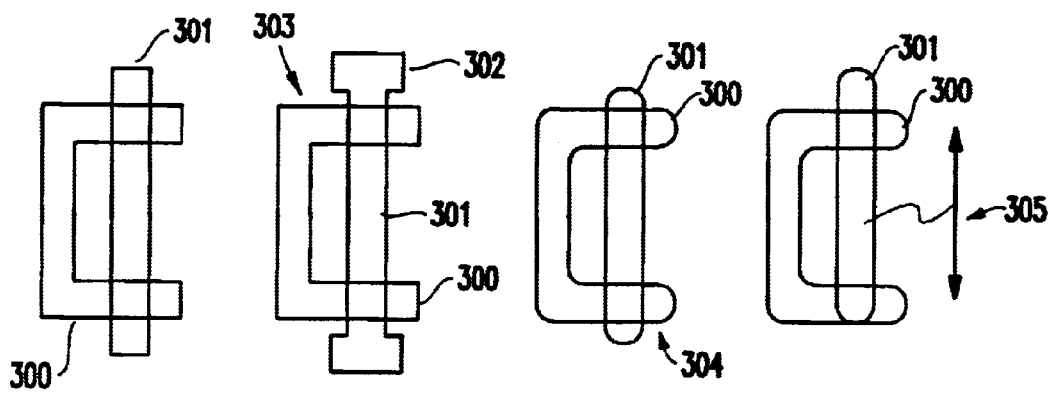
FIG. 3 is a series of design data sets and simulation data illustrating advantages of the invention.
Figure 4:
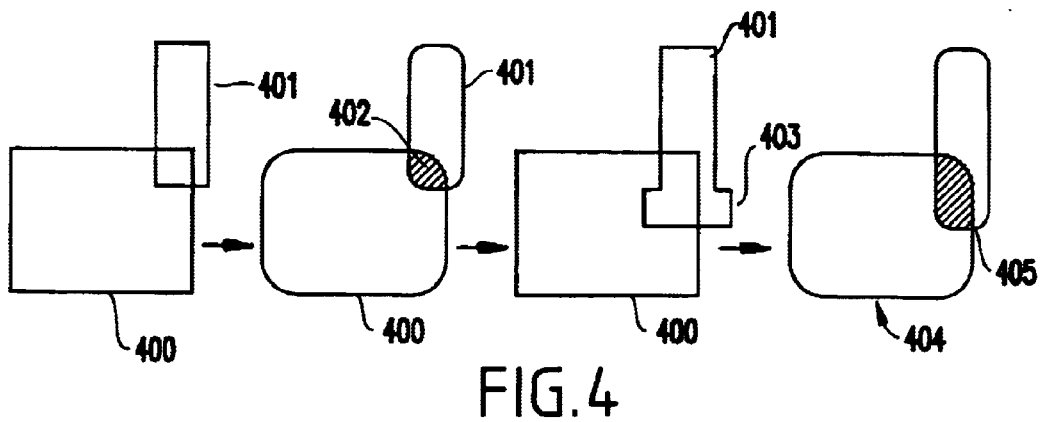
FIG. 4 is a series of design data sets and simulation data illustrating advantages of the invention.

FIGS. 2–4 are other examples that illustrate features of the invention. Note that, for simplicity, FIGS. 2–4 do not show the design data set overlaid on the simulation data, but only illustrate multiple overlaid design levels and multiple overlaid simulation levels. However, in operation, the invention preferably includes the design data set levels overlaid on the simulation data levels.

More specifically, as shown in FIG. 2, design data for one level 200 is overlaid on another level 201. Item 202 shows the overlaid shapes after the simulation is performed. Item 203 illustrates the design changes made to the design data set to compensate for shape changes that occurred to shape 201 during the simulation 202 and item 204 represent the simulation of the shape shown in item 203 which is now acceptable and can be used in production.

FIG. 3 illustrates the design data of a "C" shaped image 300 and a "I" shaped image 301. To avoid foreshortening, anchors 302 are applied to the "I" image 301 as shown in item 303. The overlaid printed images 304 are generated by the simulation tool. Item 305 illustrates how the invention affords the designer additional flexability in the design. More specifically, in item 305, the "I" image 301 is shifted within the overlay tolerance to ensure, for example, that enough optical proximity correction (OPC) has been applied to meet the alignment requirements of the printed image.

FIG. 4 similarly illustrates overlaid design data set images 400, 401. After simulation, the cross-hatch overlap area 402 is determined to be not large enough. Therefore, the designer could add an OPC correction (anchors 403) to shape 401. A second simulation 404 shows improved overlap 405. Alternatively, the designer could have moved image 401 a necessary distance instead of adding anchor 403 to achieve the desired overlay tolerances, as was done in FIG. 3 above. Therefore, as shown above, the invention provides the designer with substantial flexibility and immediate feedback regarding the results changes to the design data set will have on the simulation data.

Figure 5A:
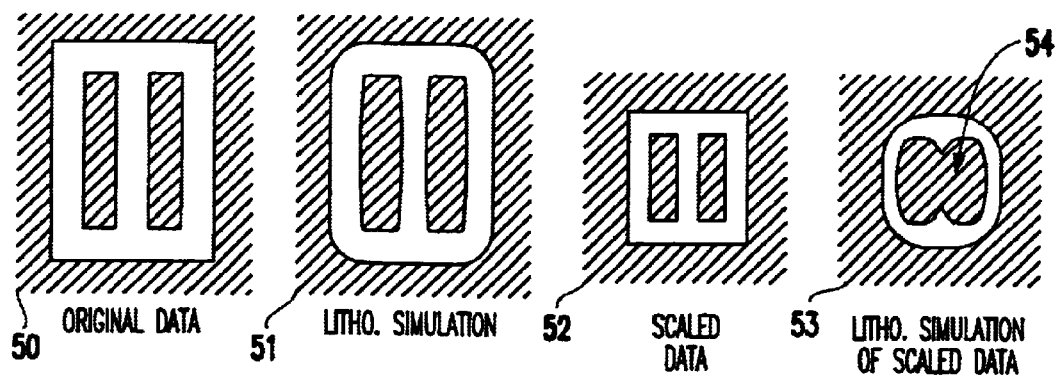
FIG. 5A is a schematic diagram illustrating a design that will not scale according to the simulation.

The system is very useful for scalable data sets as well. Scalable data sets are designed such that a scale factor can be applied to all images in the set to decrease (shrink) the overall size simulation. FIG. 5A illustrates an original design data set 50 and associated original simulation data 51 as well as scaled design data set 52 and associated simulated scaled data 53. The simulated scaled data 53 does not maintain the shape required by the scaled design data set 52. Therefore, when the simulated scaled data 53 is overlaid on the scaled design data 52, a potential defect 54 will be illustrated. The designer can then make modifications to the original design data set 50 (or the scaled design data set 52) to eliminate the potential defect 54.

Figure 5B:
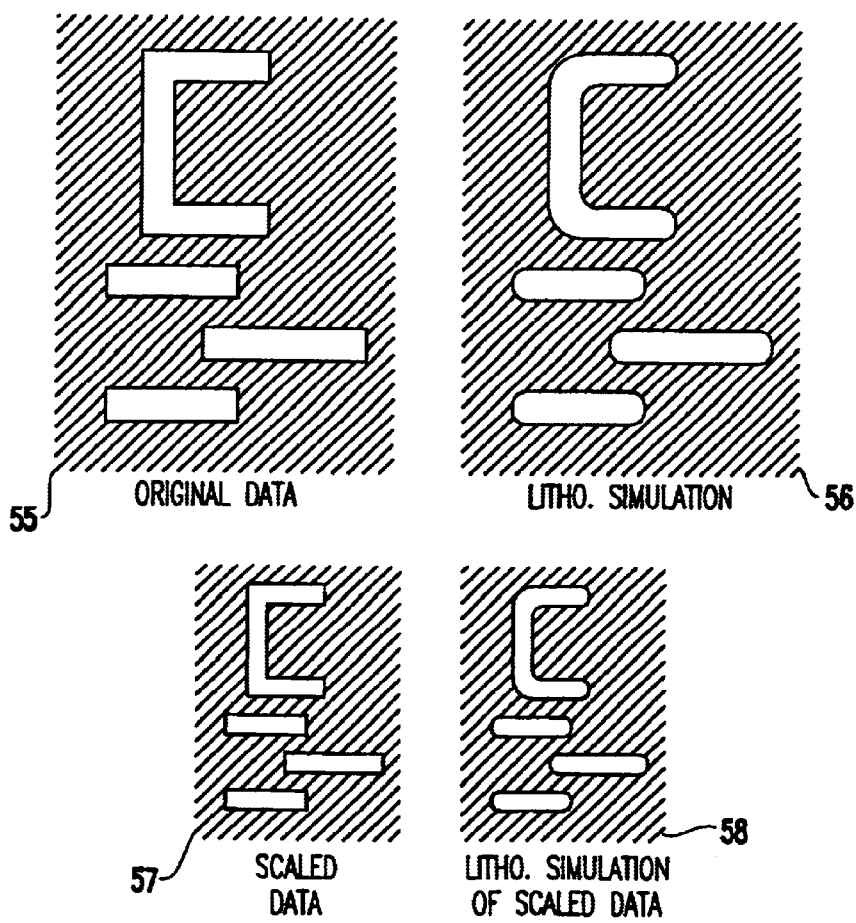
FIG. 5B is a schematic diagram illustrating a design that will scale according to the simulation.

To the contrary, FIG. 5B illustrates an example of a design that will properly scale. More specifically, the original design data set 54 and its associated simulation data 56 are illustrated. Also, the scaled design data set 57 and its associated scaled simulation data 58 are illustrated. When the scaled simulation data 58 is overlaid upon the scaled design data set 57, the designer will be able to verify that the scaling of the design data 55 will not produce potential defects.

Potential defects can be detected automatically by incorporating a design rule checking program such as Hercules, sold by Avant! of Fremont, Calif., USA. The system can be configured so that the design rule checking program is run automatically as part of the iterative procedure described above or manually by the user.

The ability to view simulated wafer printed images interactively on a screen with the original design helps the designer determine what needs to be corrected or adjusted on the original design. However, it is also important to determine if the overlap area between two levels is large enough for proper contact between the two levels given that there are variations in overlay between the two levels.

The ability to view the overlap is important, but the ability to determine if variations of overlap can be tolerated is more important. A contour plot (e.g., a plot of constant intensity of aerial images or a wafer outline of shapes in a developed or undeveloped resist) can be placed over the original design data. However, the ability of the CAD tool to determine what shapes are closed (e.g., are movable) is not obvious by just looking at the contour data itself. Therefore, another embodiment of the invention includes a system that determines what shapes are closed prior to loading the data into CAD programs. The CAD programs perform certain functions such as moving the shapes, calculating the area of shapes, calculating the intersection area between two levels, expanding or shrinking the shapes, etc. By overlaying the simulation data on the design data, the invention allows the designer to know the immediate impact of closing shapes and/or shrinking/expanding shapes, as discussed in the following examples.

Figure 6A:
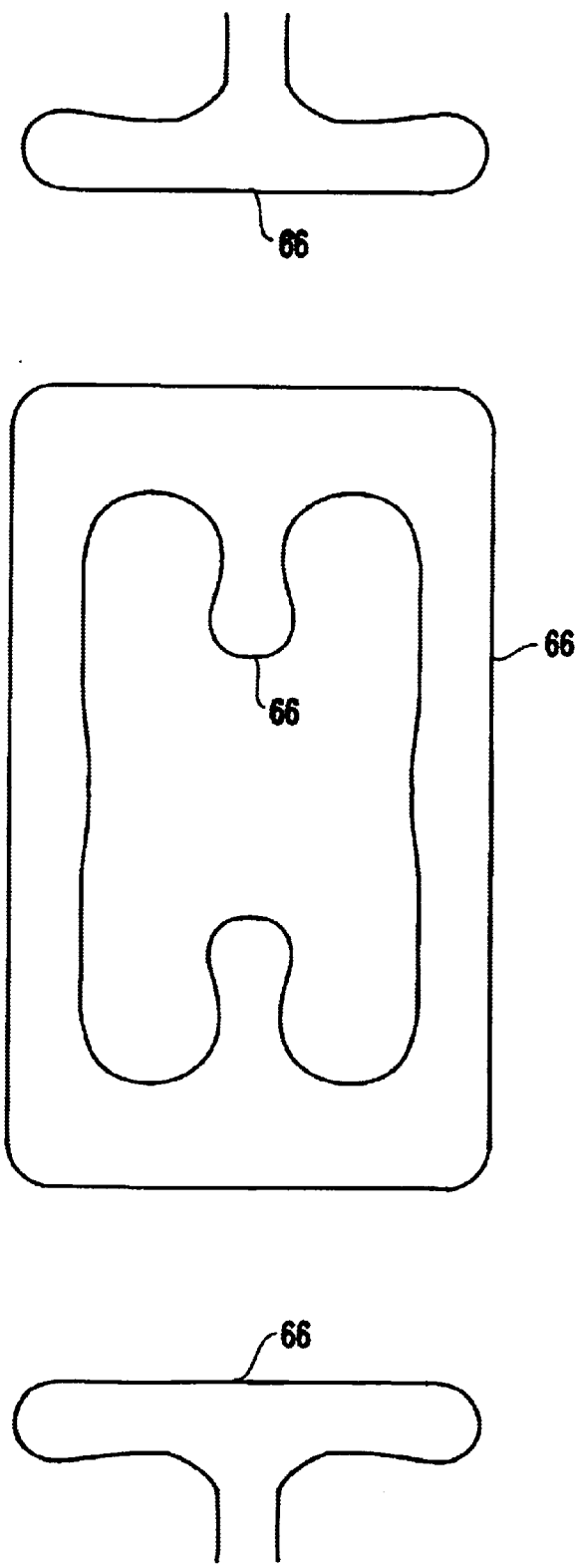
FIG. 6A is a schematic diagram of a contour result of a simulation of a periodic structure.
Figure 6B:
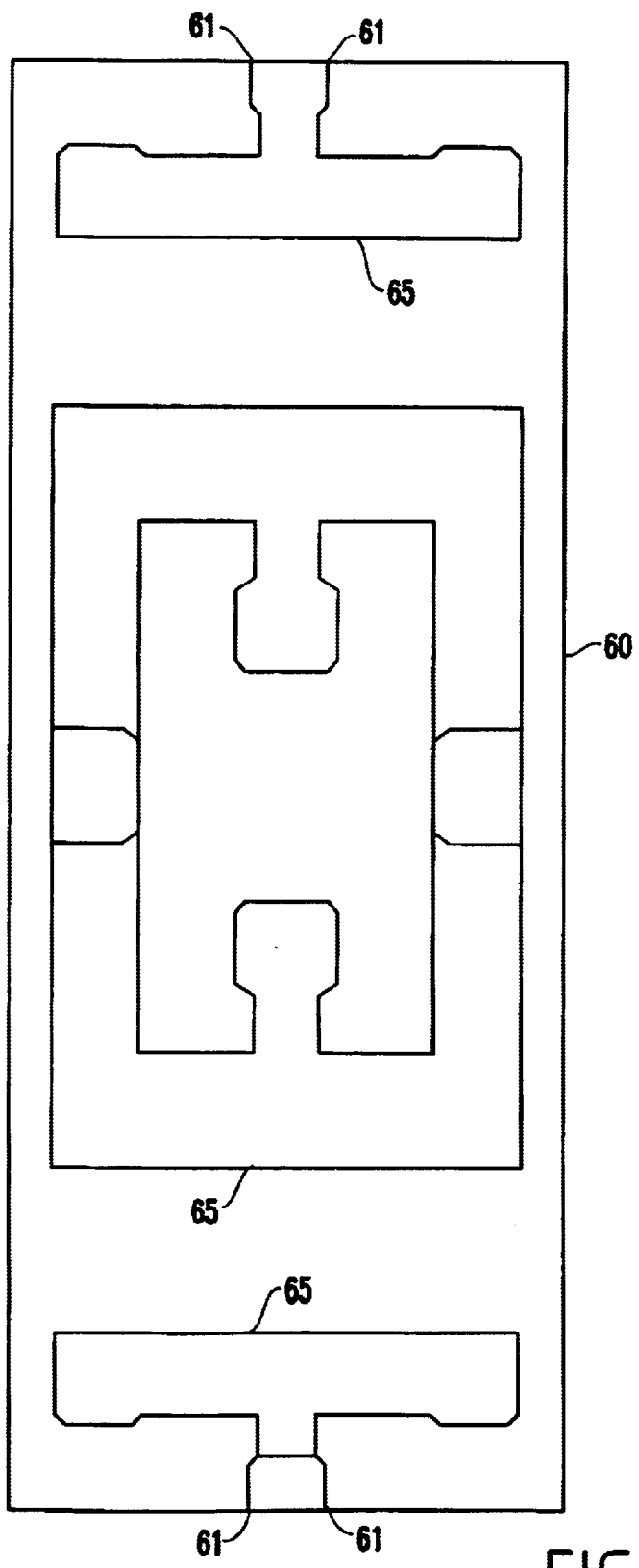
FIG. 6B is a schematic diagram of a design of a periodic structure intersected with an outline.
Figure 6C:
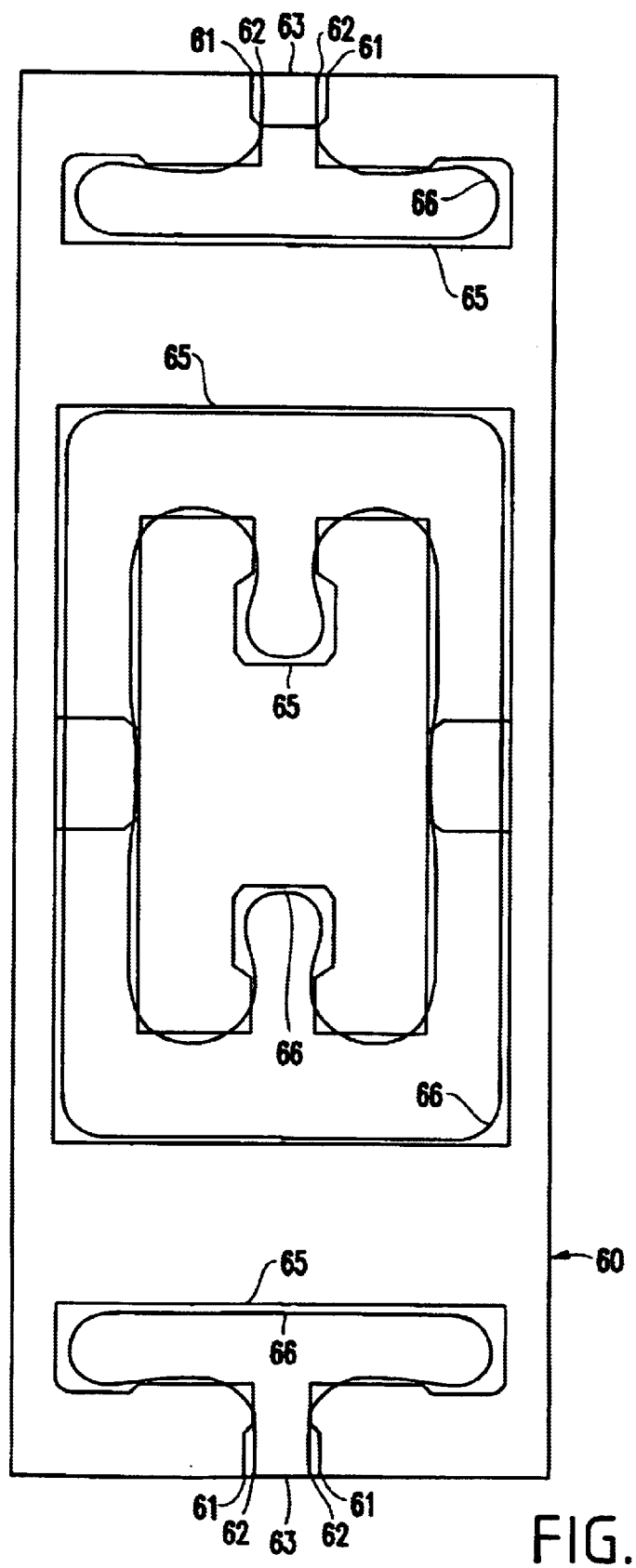
FIG. 6C is a schematic diagram of the contour plot and design intersected with an outline.
Figure 6D:
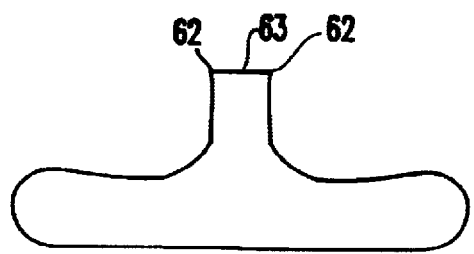
FIG. 6D is a schematic diagram of the contour plot with the contour plots closed.
Figure 6D:
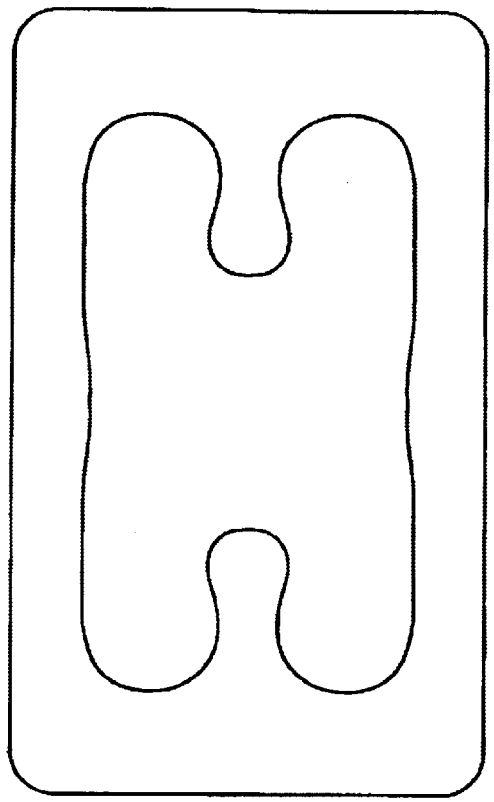
Figure 6D:
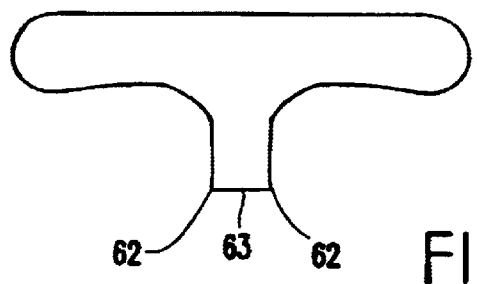

One embodiment of the invention comprises a procedure to close all the line contours within a frame or outline to make the simulation data format consistent with the CAD design data format. FIG. 6A is a contour line plot 66 of a result of lithography simulation of the periodic design 65 also shown in FIG. 6B. The lithography simulation requires a bounding shape (e.g., outline 60 in FIG. 6B) for periodic structures and truncates contours on this bounding shape. The outline 60 is intersected with the shapes in either the original design 65 or contour plot 66 (e.g., FIG. 6C). Points 61 in FIGS. 6B and 6C show where the original design 65 intersects the outline 60. FIG. 6C shows the intersecting points 62 of the contour lines 66 with the original design 65 in the outline 60. Shapes that intersect the outline are truncated and closed 63, as discussed below. FIG. 6D shows the points 62 on the contour line 66 that closely match the points 61 on the original design 65 that intersect the outline 60. Note that the contour lines 66 that touch the outline 60 are closed 63.

Figure 6E:
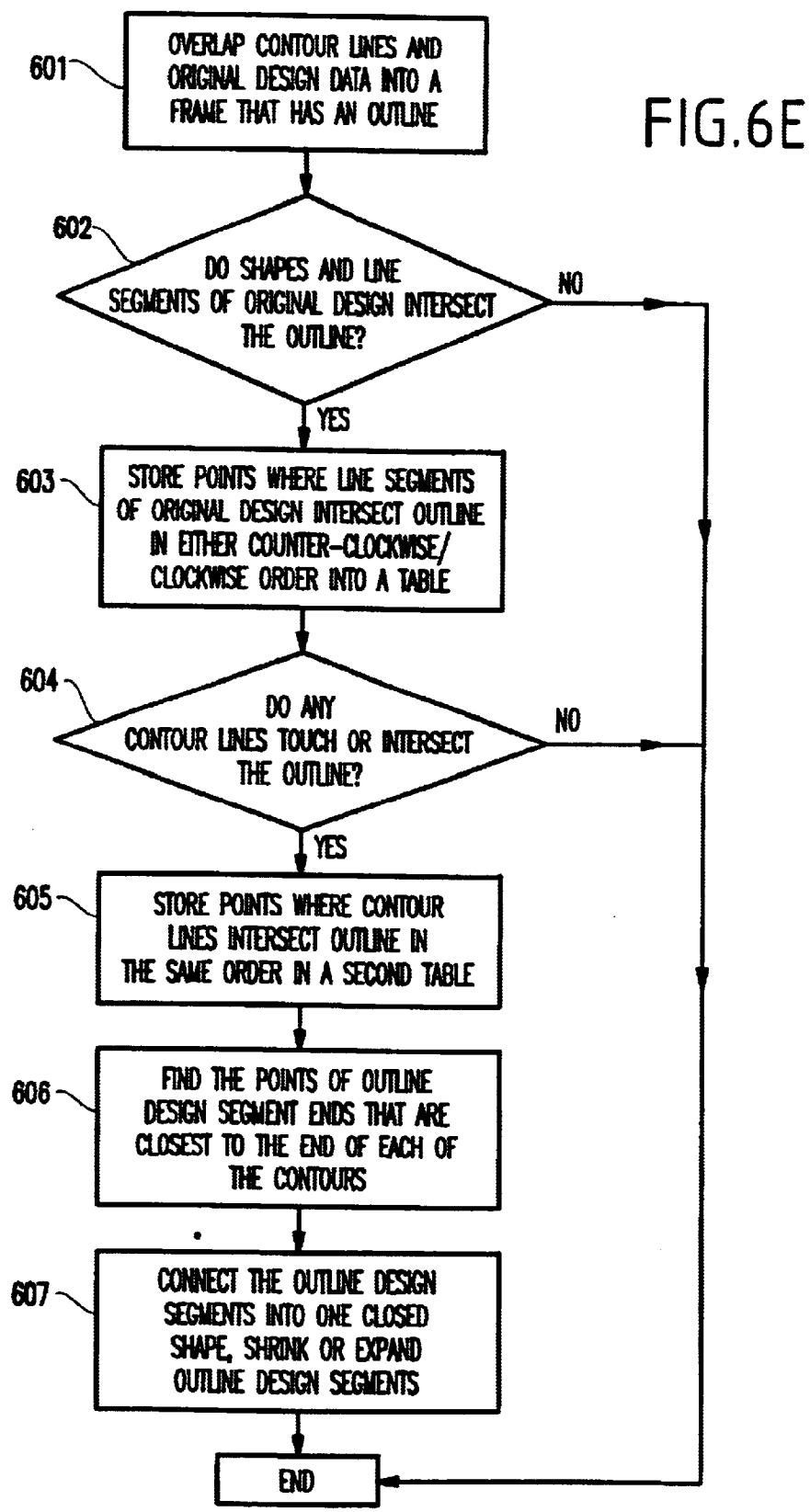
FIG. 6E is a flow diagram of the algorithm for closing contours to form shapes.

FIG. 6E is a flow diagram illustrating this embodiment of the invention. As shown in item 601 in FIG. 6E, the contour lines 66 are overlapped with the original design data 65 line segments within a frame that has an outline 60. As shown in item 602, if the shapes and line segments of the original design 65 intersect the outline 60, then the points 61 at which the original design data 65 line segments touch the outline 60 are stored in a first table in either a clockwise or counterclockwise order around the outline 60 (item 603).

In a similar manner, if the contour lines 66 intersect the outline 60 (item 604), the points 62 where the contour lines 66 intersect the outline 60 are stored in a second table in the same order that the points were stored in the first table, as shown in item 605.

In item 606, the points 62 where the contour lines 66 intersect the outline 60 are read from the second table and compared with points 61 where the original design data 65 line segments intersect the outline 60 as recorded in the first table to determine which points should be connected to form a closed shape.

Figures 7A, 7B:
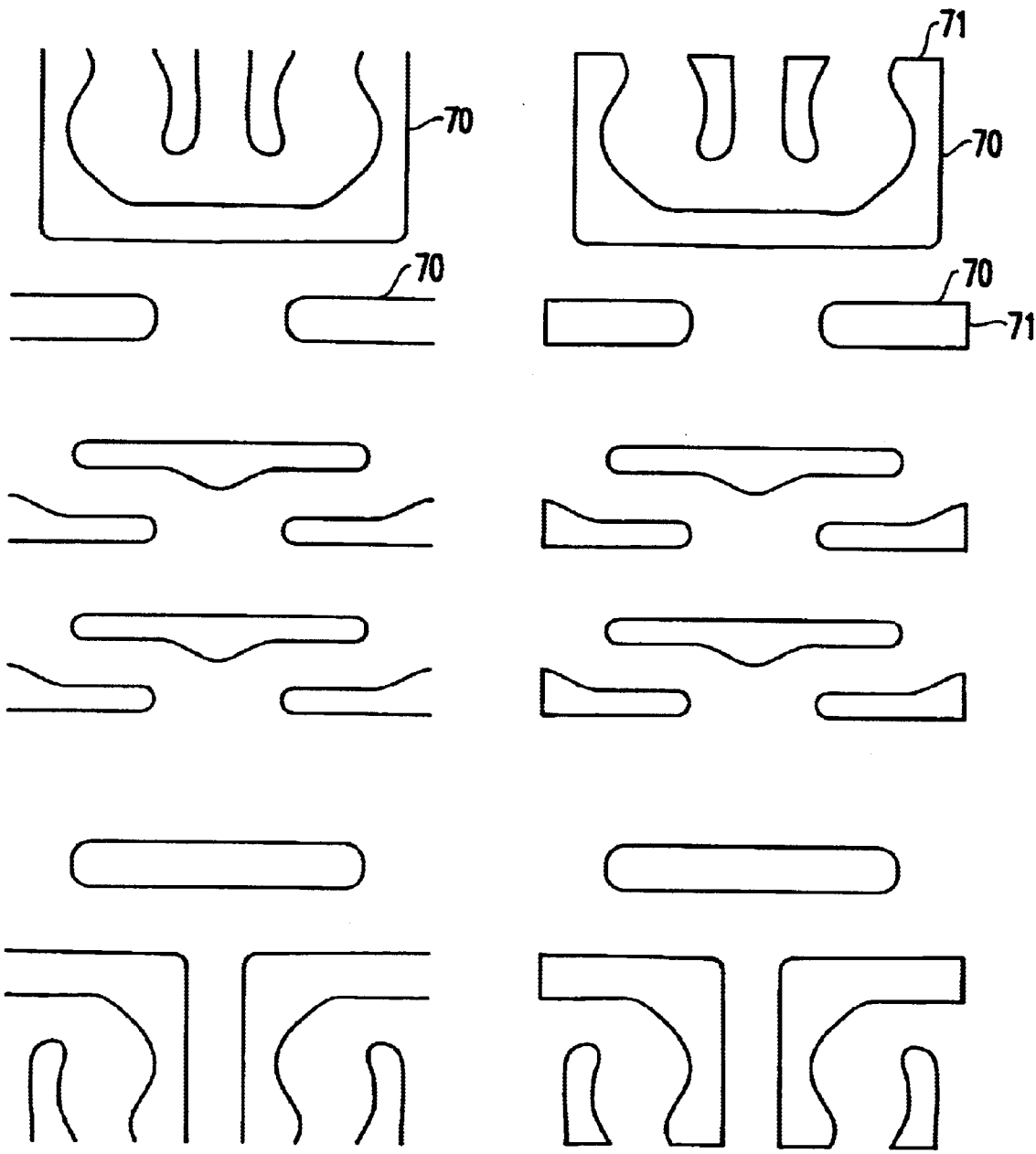
FIG. 7A is a schematic diagram of another example of a contour of a periodic structure.
FIG. 7B is a schematic diagram of the contour plot with the contour plots closed.

A line 63, which is co-linear with the outline 60 and runs between the points 61 where the original design data 65 line segments intersect the outline 60, is added to the original design data 65 to close the shape, as shown in item 607. The co-linear line 32 is then expanded or shrunk to match the points 62 where the contour lines 66 intersect the outline 60 so that the contour 66 will also include closed shapes, as shown in FIG. 6D. FIG. 7A is another example of contour lines 70 and FIG. 7B is the end result of applying the invention to include the end lines 71 that are co-linear with the outline.

Figure 8:
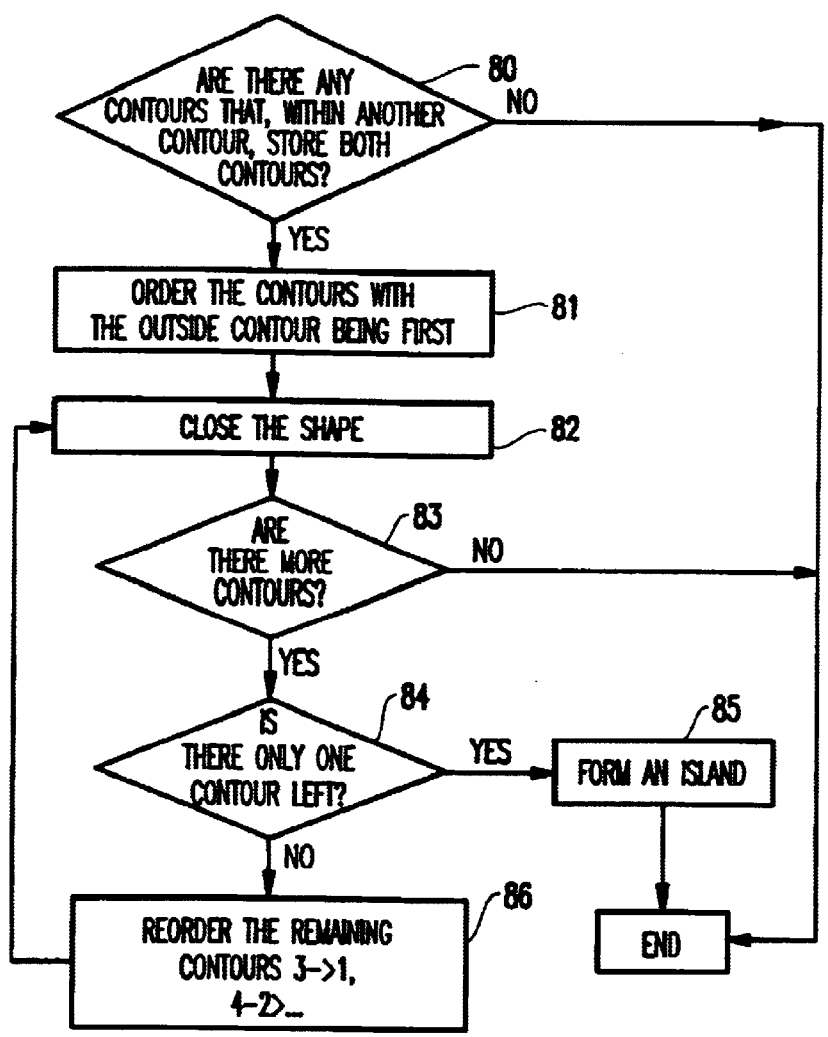
FIG. 8 is a flow diagram illustrating a preferred method of the invention.

FIG. 8 is a flow diagram that illustrates another embodiment of the invention that handles closed shapes within larger closed shapes as shown in FIGS. 9A–9E, again, to make the format of the simulation data consistent with the format of the CAD design data. In item 80, if there are contours 91 that are within another contour 90, then both contours are stored. The outside contour 90 is stored first as shown in item 81. In item 82, the shape (e.g., shape A—FIG. 9B) between the outermost two contours 90, 91 is closed.

If there are no more contours the process ends, as shown in item 83. If only one contour is left (e.g., contour 92—FIG. 9C), as shown in item 84, then an island (Shape B—FIG. 9D) is formed, as shown in item 85. If there is more than one contour left (e.g., contours 92, 93—FIG. 9E), then the remaining contours are reordered and the process continues, as shown in item 86.

Figure 9A:
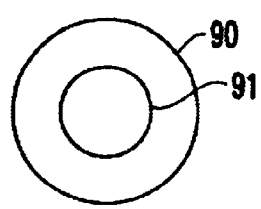
FIG. 9A is a schematic diagram of a contour within another.
Figure 9B:
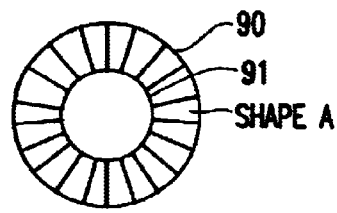
FIG. 9B is a schematic diagram of contour plots resulting from correctly using the flow diagram.
Figure 9C:
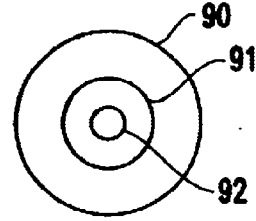
FIG. 9C is a schematic diagram of two contours within another.
Figure 9D:
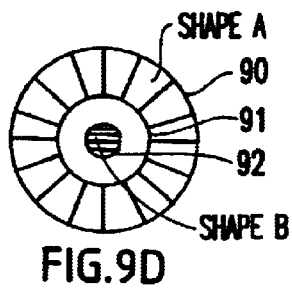
FIG. 9D is a schematic diagram of contour plots resulting from correctly using the flow diagram.
Figure 9E:
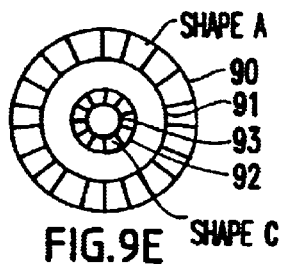
FIG. 9E is a schematic diagram of correctly using the flow diagram on three contours within another.

If one contour is within another contour, the inside contour will be a hole inside the large contour (e.g., a donut as shown in FIG. 9B). The process proceeds inwardly for multiple contours within each other, by moving from the outer most one 90 to the inner most one 93. As mentioned above, FIG. 9A has two contours, contour 91 within contour 90. This can be mapped into a closed shape A (e.g., a donut) as shown in FIG. 9B. FIG. 9C has three contours lines 92 within contours 91 and 90. This can be mapped into two shapes A and B (e.g., a donut with an island inside). FIG. 9E is another example of applying the above technique which forms two shapes A and C (e.g., two donuts).

Most VLSI CAD programs need closed shapes to be able to move the shapes around. With the invention, these and other programs can now work on the simulation data contour plots as if the contours were the original design data.

Figure 10A:
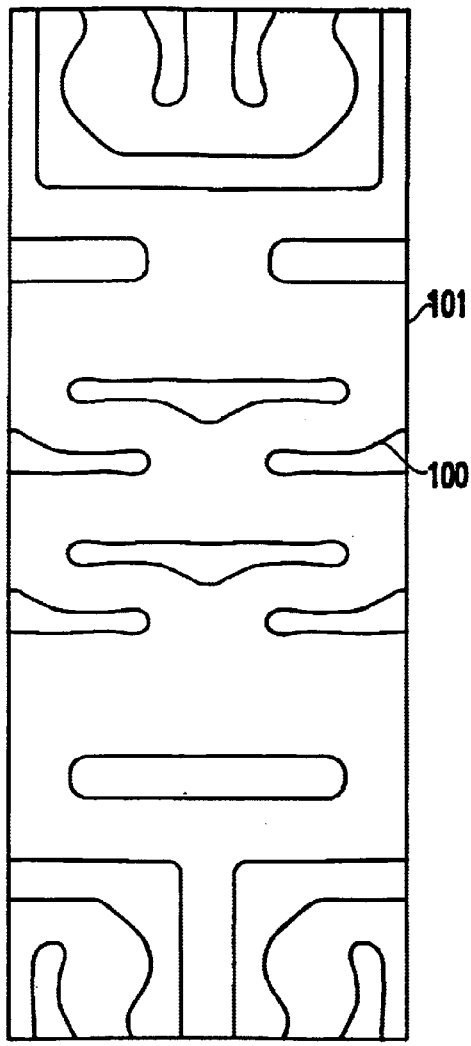
FIG. 10A is a schematic diagram of a contour plot of a periodic structure intersected with an outline.
Figure 10B:
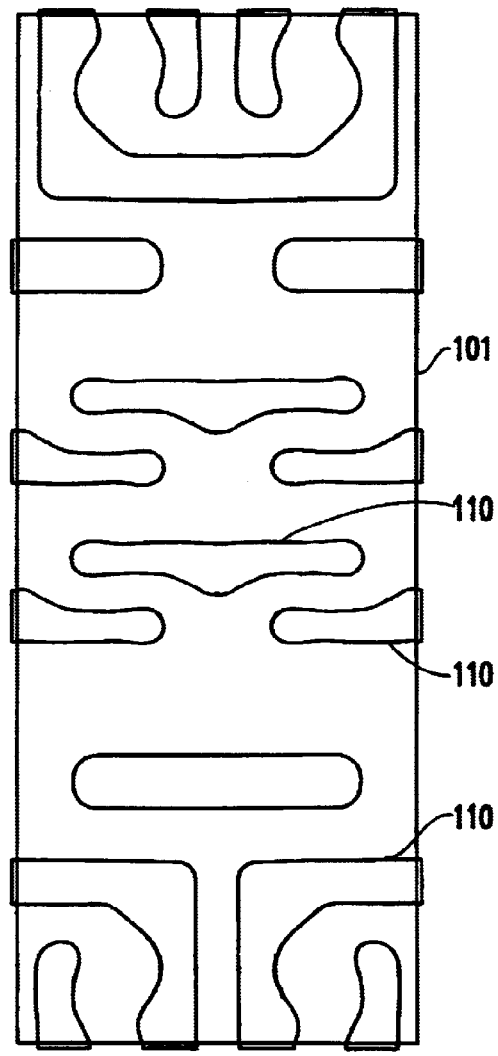
FIG. 10B is a schematic diagram showing the result of expanding the contour lines.
Figure 10C:
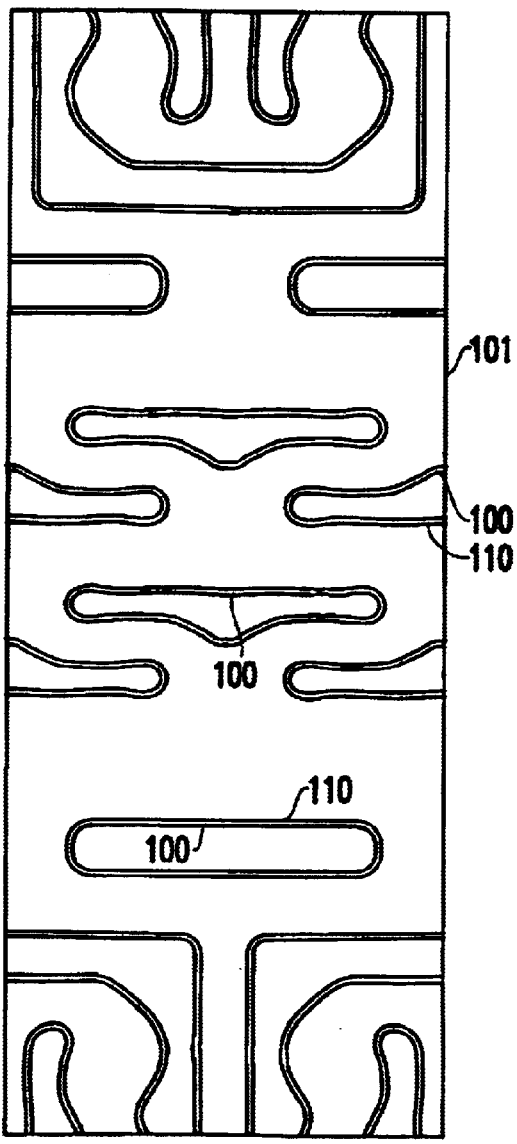
FIG. 10C is a schematic diagram of the original contours and the expanded shapes of the original shapes.

The invention is also very useful in expanding or contracting the shapes of the contours to simulated etching or deposition (or growth or shrinkage) of the shapes with an outline, as shown in FIGS. 10A–10C. As shown in FIG. 10A, the invention begins with closed shapes 100 within an outline 101, which may be formed as discussed above. FIG. 10B illustrates an expansion (e.g., shapes 110) function used in the CAD tool. FIG. 10C is the original shapes 100 merged with the expanded shapes 110 and the outline 101. The expanded shapes 110 are modified to include an edge which is co-linear with the outline 101, as shown in FIG. 10C.

Figure 11A:
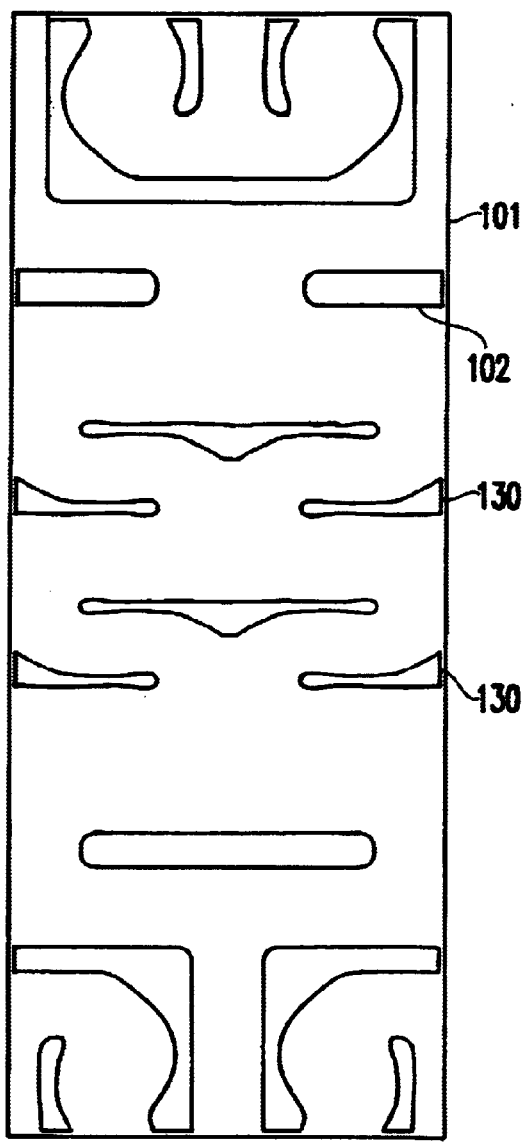
FIG. 11A is a schematic diagram of a contour shrunk incorrectly.

However, when shapes are shrunk within an outline, more complicated processing is involved. Again, beginning with the shapes shown in FIG. 10A, the invention expands all the line segments of the shapes 100 which are to be shrunk and are co-linear with the outline 101 to include expanded portions 140, as shown in FIG. 11C. By performing such expanded portions 140, when the shapes are shrunk, they will fit within the outline 101, as shown in FIG. 11B. Note that FIG. 11B also illustrates the original shapes 100 for comparison. To the contrary, if the shapes 100 shown in FIG. 10A are simply shrunk, without any adjustment, the shapes 102 shown in FIG. 11A which do not extend to the outline 101 will be produced. In other words, before the shrinking operation is performed, the invention moves the line segments perpendicular to the outline and outward by the shrinkage amount to expanded portions 140 to allow the shapes to be positioned against the outline after the shrinkage operation.

Figure 12:
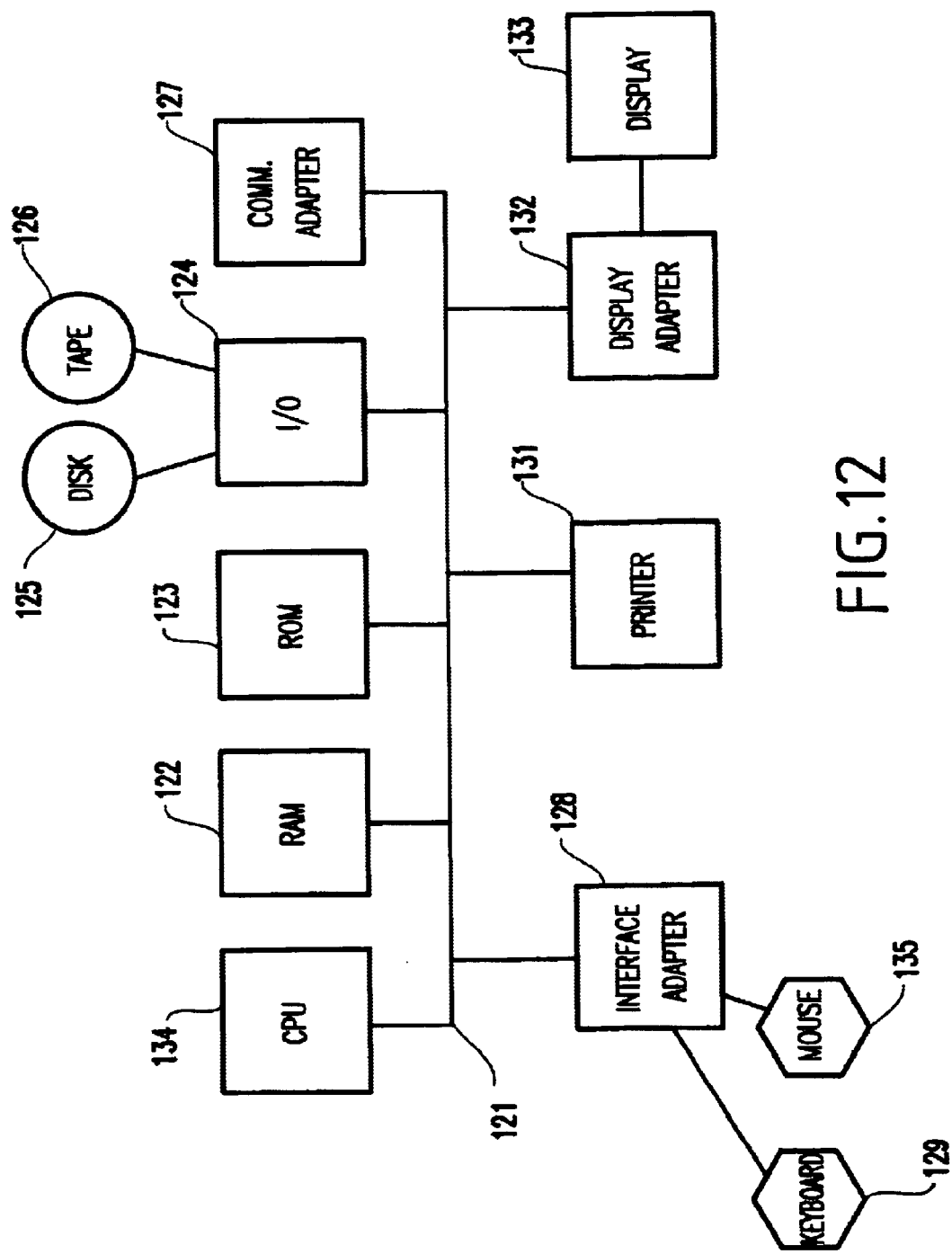
FIG. 12 is a hardware embodiment of the invention.

As illustrated in FIG. 12, a typical hardware configuration of an information handling/computer system in accordance with the invention preferably has at least one processor or central processing unit (CPU) 134.

The CPU 134 is interconnected via a system bus 121 to a random access memory (RAM) 122, read-only memory (ROM) 123, input/output (I/O) adapter 124 (for connecting peripheral devices such as disk units 125 and tape drives 126 to the bus 121), communication adapter 127 (for connecting an information handling system to a data processing network) user interface adapter 128 (for connecting peripherals 129, 135 such as a keyboard, mouse, microphone speaker and/or other user interface devices to the bus 121), a printer 131, and display adapter 132 (for connecting the bus 121 to a display device 133).

The invention could be implemented using the structure shown in FIG. 12 by including the inventive method within a computer program stored on the storage device 125 and providing the central processing unit 134 with optical proximity connection information from a network connected to the communication adapter 127. Such a computer program would act on the optical proximity connection information supplied through the interface unit 129, 135 or through the network connection 127. The system would then automatically produce the final desired product on the display 133, through the printer 131 or back to the network 127.

Thus, as discussed above, the invention allows device designers to simultaneously view both as-designed images and simulated printed images on a standard design system and to manipulate both image types with the standard tool kits of the design system. The invention overcomes the problems of conventional systems by converting the simulation data to a format which is consistent with the format of the design data. By overlaying the simulation data on the design data, the specific corrections which should be made to the design data set become easier to recognize. Further, the invention may produce the simulation data as the designer creates/modifies the design data set so that the conventional iterative process of repeatedly producing the simulation data and modifying the design data set is eliminated.

This invention is not limited to the previous illustrations and can be used with any application where shapes are generated by a CAD program, subsequently modeled, and the results of the modeling are used to revise the original design. For instance, the design of castings, stampings or forgings which will be subsequently machined can use this approach, given a suitable model for the machining process, to determine the optimal starting shape for the machining process.

While the invention has been described in terms of preferred embodiments, those skilled in the art will recognize that the invention can be practiced with modification within the spirit and scope of the appended claims.

What is claimed is:

1. A method of creating a photomask data set comprising:
   inputting a design data set having at least two levels;
   creating a simulated printed data set having said levels by applying a set of simulation model rules to each level of said design data set;
   merging each level of said design data set with each corresponding level of said simulated printed data set to produce a merged design data set;
   applying at least one test to said merged design data set;
   correcting said design data set based on results of said test to produce a corrected design data set;
   repeating said creating of said simulated printed data, said merging, said applying of said test and said correcting using said corrected design data set until said corrected design data set passes said test; and
   outputting said corrected design data set as said photomask data set.

2. The method in claim 1, further comprising converting a format of said simulated printed data set to comply with a format of said design data set.

3. The method in claim 1, wherein said merging includes overlaying each level of said design data set on each corresponding level of said simulated printed data to produce overlaid images.

4. The method in claim 3, wherein said test comprises identifying differences between each level of said overlaid images.

5. The method in claim 1, wherein said creating of said simulated printed data set and said merging are performed in real time as said design data set is corrected.

6. A method of creating photomask data comprising:
   inputting design data;
   producing simulated printed data from said design data;
   overlaying said design data on said simulated printed data to produce overlaid data;
   testing said overlaid data;
   correcting said design data based on results of said test to produce corrected design data;
   repeating said producing, said overlaying, said testing and said correcting using said corrected design data until said corrected design data passes said testing; and
   outputting said corrected design data as said photomask data.

7. The method in claim 6, further comprising converting a format of said simulated printed data to comply with a format of said design data.

8. The method in claim 6, wherein said testing comprises identifying differences between shapes on one level and shapes on another level of said overlaid data.

9. The method in claim 6, wherein said producing of said simulated printed data and said overlaying are performed in real time as said design data is corrected.

10. The method in claim 6, wherein said producing of said simulated printed data modifies said design data to include predicted manufacturing changes.

11. The method in claim 6, wherein said design data includes multiple levels, said simulated printed data include multiple levels, and said overlaid data includes multiple levels of overlaid images.

12. The method in claim 11, wherein said multiple levels of overlaid images are distinguished by one of color, shading arid brightness.

13. A method of creating photomask data comprising:
    inputting design data;
    producing simulated printed data from said design data;
    altering a format of said simulated printed data to comply with a format of said design data;
    overlaying said design data to detect differences between said design data and said simulated printed data:
    correcting said design data based on said differences between said design data and said simulated printed data to produce corrected design data;
    repeating said producing, said altering, said overlaying, and said correcting using said corrected design data until said corrected design data is functionally the same as said design data; and
    outputting said corrected design data as said photomask data.

14. The method in claim 13, wherein said producing and said overlaying are performed in real time as said design data is corrected.

15. The method in claim 13, wherein said producing of said simulated printed data modifies said design data to include predicted manufacturing changes.

16. The method in claim 13, wherein said design data includes multiple levels, said simulated printed data include multiple levels, and said overlaying produces multiple levels of overlaid images.

17. The method in claim 16, wherein said multiple levels of overlaid images are distinguished by one of color, shading and brightness.

18. A program storage device readable by machine, tangibly embodying a program of instructions executable by the machine to perform a method for creating a photomask data set, said method comprising:
    inputting a design data set having at least two levels;
    creating a simulated printed data set having said levels by applying a set of simulation model rules to each level of said design data set;
    merging each level of said design data set with each corresponding level of said simulated printed data set to produce a merged design data set;

applying at least one test to said merged design data set;

correcting said design data set based on results of said test to produce a corrected design data set;

repeating said creating of said simulated printed data, said merging, said applying of said test and said correcting using said corrected design data set until said corrected design data set passes said test; and outputting said corrected design data set as said photomask data set.

19. The program storage device in claim 18, wherein said method further comprises converting a format of said simulated printed data set to comply with a format of said design data set.

20. The program storage device in claim 18, wherein said merging includes overlaying each level of said design data set on each corresponding level of said simulated printed data to produce overlaid images.

21. The program storage device in claim 20, wherein said test comprises identifying differences between each level of said overlaid images.

22. The program storage device in claim 18, wherein said creating of said simulated printed data set and said merging are performed in real time as said design data set is corrected.

23. The program storage device in claim 18, wherein said creating of said simulated printed data set modifies said design data set to include predicted manufacturing changes.

* * * * *